United States Patent
Arifeen et al.

(10) Patent No.: US 11,869,862 B2
(45) Date of Patent: *Jan. 9, 2024

(54) MICROELECTRONIC COMPONENTS INCLUDING METAL PILLARS SECURED TO BOND PADS, AND RELATED METHODS, ASSEMBLIES, AND SYSTEMS

(71) Applicant: Micron Technology, Inc., Boise, ID (US)

(72) Inventors: Shams U. Arifeen, Boise, ID (US); Christopher Glancey, Boise, ID (US); Koustav Sinha, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/653,610

(22) Filed: Mar. 4, 2022

(65) Prior Publication Data

US 2022/0189899 A1 Jun. 16, 2022

Related U.S. Application Data

(63) Continuation of application No. 16/804,413, filed on Feb. 28, 2020, now Pat. No. 11,276,659.

(51) Int. Cl.
*H01L 23/00* (2006.01)

(52) U.S. Cl.
CPC .............. *H01L 24/13* (2013.01); *H01L 24/03* (2013.01); *H01L 24/05* (2013.01); *H01L 24/11* (2013.01);

(Continued)

(58) Field of Classification Search
CPC ......... H01L 24/13; H01L 24/03; H01L 24/05; H01L 24/11; H01L 24/81;

(Continued)

(56) References Cited

U.S. PATENT DOCUMENTS

| 11,276,659 B2 * | 3/2022 | Arifeen ................... H01L 24/16 |
| 2006/0237855 A1 * | 10/2006 | Kroehnert ......... H01L 23/49838 257/781 |

(Continued)

FOREIGN PATENT DOCUMENTS

| CN | 101911292 A | 12/2010 |
| CN | 102347298 A | 2/2012 |

(Continued)

OTHER PUBLICATIONS

Chinese Second Office Action for Chinese Application No. 202110204327.0, dated Sep. 28, 2022, 18 pages with translation.

(Continued)

*Primary Examiner* — Douglas W Owens
(74) *Attorney, Agent, or Firm* — TraskBritt

(57) ABSTRACT

A microelectronic component comprises a substrate having at least one bond pad on a surface thereof and a metal pillar structure on the at least one bond pad, the metal pillar structure comprising a metal pillar on the at least one bond pad and a solder material having a portion within a reservoir within the metal pillar and another portion protruding from an end of the metal pillar opposite the at least one bond pad. Methods for forming the metal pillar structures, metal pillar structures, assemblies and systems incorporating the metal pillar structures are also disclosed.

17 Claims, 10 Drawing Sheets

(52) U.S. Cl.
CPC .... *H01L 24/81* (2013.01); *H01L 2924/01028* (2013.01); *H01L 2924/01029* (2013.01); *H01L 2924/01079* (2013.01); *H01L 2924/1434* (2013.01)

(58) Field of Classification Search
CPC ..... H01L 2924/1434; H01L 2224/0401; H01L 2224/1147; H01L 2224/11903; H01L 2224/13023; H01L 2224/13083; H01L 24/16; H01L 2224/10145; H01L 2224/13017; H01L 2224/13076; H01L 2224/13563; H01L 2224/1357; H01L 2224/16057; H01L 2224/16058; H01L 2224/16238; H01L 2224/81191; H01L 2224/81203; H01L 2224/8121; H01L 2224/81815; H01L 23/49811; H01L 21/4853; H01L 23/49838
See application file for complete search history.

(56) References Cited

U.S. PATENT DOCUMENTS

| | | |
|---|---|---|
| 2010/0246150 A1 | 9/2010 | Wong et al. |
| 2011/0133334 A1 | 6/2011 | Pendse |
| 2011/0304058 A1 | 12/2011 | Pendse |
| 2013/0234318 A1 | 9/2013 | Lee et al. |
| 2015/0037971 A1 | 2/2015 | Arvin et al. |
| 2016/0118319 A1 | 4/2016 | Jeon et al. |
| 2016/0126201 A1 | 5/2016 | Arvin et al. |
| 2016/0372430 A1 | 12/2016 | Arvin et al. |
| 2017/0263498 A1 | 9/2017 | Aoki et al. |
| 2018/0082968 A1 | 3/2018 | Arvin et al. |
| 2018/0212339 A1 | 7/2018 | Li et al. |

FOREIGN PATENT DOCUMENTS

| | | |
|---|---|---|
| CN | 108292610 A | 7/2018 |
| CN | 113327908 A | 8/2021 |
| TW | 201545251 A | 12/2015 |

OTHER PUBLICATIONS

Chinese First Office Action for Chinese Application No. 202110204327.0, dated Apr. 25, 2022, 18 pages with translation.

Taiwanese Search Report and Office Action from Taiwanese Application No. 110104434, dated Jun. 2, 2022, 13 pages with English translation.

* cited by examiner

US 11,869,862 B2

MICROELECTRONIC COMPONENTS INCLUDING METAL PILLARS SECURED TO BOND PADS, AND RELATED METHODS, ASSEMBLIES, AND SYSTEMS

CROSS-REFERENCE TO RELATED APPLICATION

This application is a continuation of U.S. patent application Ser. No. 16/804,413, filed Feb. 28, 2020, now U.S. Pat. No. 11,276,659, issued Mar. 15, 2022, the disclosure of which is hereby incorporated herein in its entirety by this reference.

TECHNICAL FIELD

Embodiments disclosed herein relate to conductive elements for microelectronic components and a method of forming such conductive elements. More particularly, embodiments disclosed herein relate to conductive elements in the form of conductive pillar structures comprising solder, methods of forming such conductive pillar structures, and to microelectronic components, assemblies and electronic systems incorporating such conductive pillar structures.

BACKGROUND

Conductive elements in the form of solder-capped conductive pillars comprising a solid metal (e.g., copper) pillar topped with a solder mass have been used extensively to physically and electrically connect microelectronic components to one another and to substrates in a so-called "flip chip" orientation in which a microelectronic component (e.g., semiconductor die) is inverted and bonded, active surface down, to another component by mass reflow or thermocompression bonding. While providing relatively robust connections for power, ground\bias and data signal communication, as operational demands in terms of increased temperature swings in thermal cycling, ever-increasing numbers of thermal cycles during operational lifespans of electronic systems increase the potential for failure in the solder joint. Further, increasingly smaller microelectronic component form factors with attendant smaller bond line (i.e., space between two superimposed components) thicknesses to accommodate package height limitations, smaller conductive pillar sizes and pitches and consequent reduced solder volumes per pillar to accommodate larger numbers of pillars as well as smaller line-spacing requirements for substrate design increase the potential for inadequate solder volume (i.e., "solder starvation") leading to void formation on the surface of or within the solder and an open circuit.

FIGS. 1A and 1B illustrate an example of a cylindrical metal pillar topped with a cap of solder material (e.g., Sn/Ag solder material). FIG. 2A reveals an open circuit between a solder cap S on a copper pillar P and a copper terminal pad T having a Ni coating to prevent electromigration illustrating that a solder joint was never achieved due to insufficient solder. FIG. 2B, on the other hand, reveals a potential for an open circuit in the form of a void V in the solder S capping copper pillar P and contacting a Ni coating over a portion of a copper substrate trace. While solder S does extend between copper pillar P and the Ni trace coating, such a connection is highly susceptible to failure under thermal cycling encountered during operation, if not during burn-in and characterization as so-called "infant mortality."

DETAILED DESCRIPTION

Figure 1A:
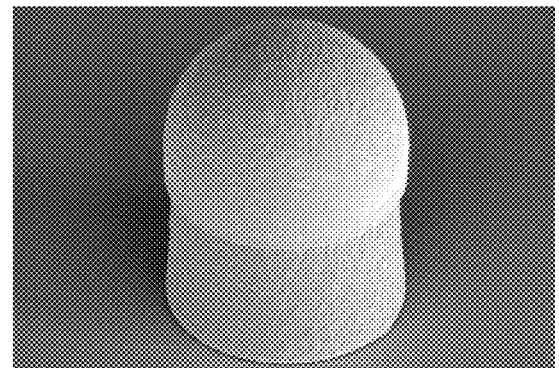
FIGS. 1A and 1B are photomicrographs of an example of a cylindrical metal pillar capped with solder.
Figure 1B:
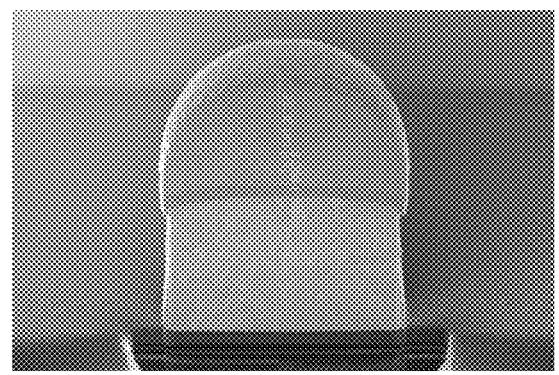
Figure 2A:
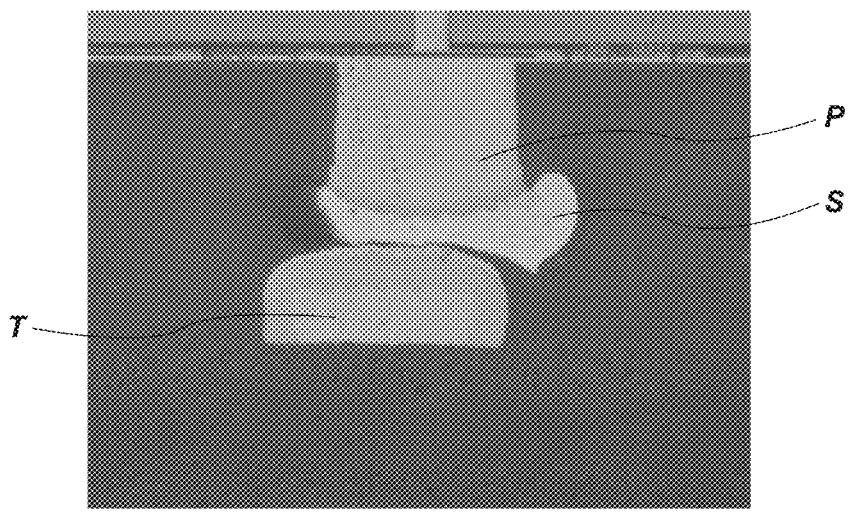
FIG. 2A is a photomicrograph of an open circuit between a solder-capped cylindrical metal pillar and a terminal pad due to insufficient solder volume.
Figure 2B:
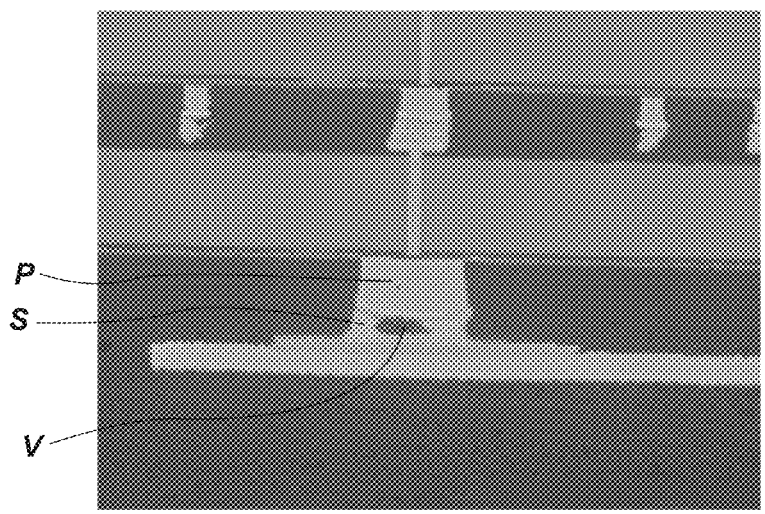
FIG. 2B is a photomicrograph of a solder joint between a cylindrical metal pillar and a conductive trace, the solder joint presenting an internal void due to insufficient solder volume.
Figure 3:
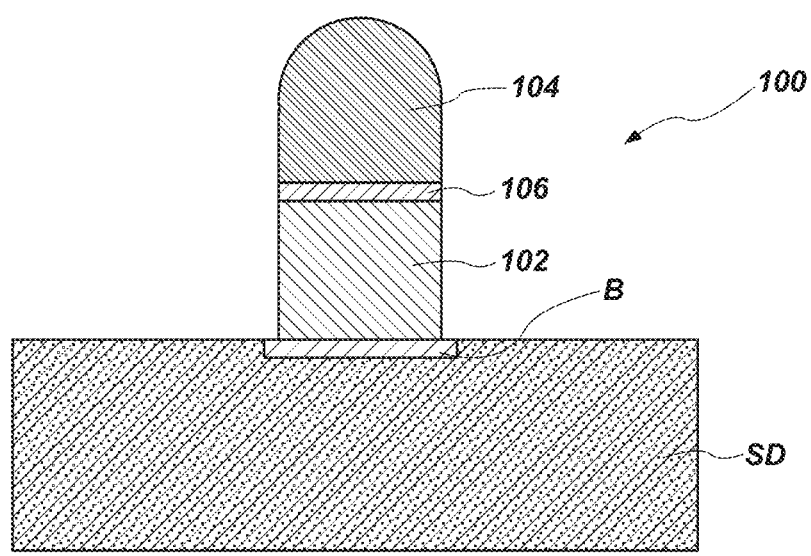
FIG. 3 is a schematic side elevation of a substrate having a cylindrical solder-capped metal pillar structure thereon.

Conductive elements in the form of metal pillar structures comprising metal pillars having solder capping and extending into an internal reservoir of the metal pillar are described, as well as a process for fabricating such metal pillar structures, microelectronic components equipped with such metal pillar structures, and electronic systems comprising microelectronic components so equipped.

The following description provides specific details, such as sizes, shapes, material compositions, and orientations in order to provide a thorough description of embodiments of the disclosure. However, a person of ordinary skill in the art will understand and appreciate that the embodiments of the disclosure may be practiced without necessarily employing these specific details, as embodiments of the disclosure may be practiced in conjunction with conventional fabrication techniques employed in the industry. In addition, the description provided below may not form a complete process flow for manufacturing metal pillar structures having solder capping and extending into an internal reservoir of the pillar, a microelectronic component equipped with such metal pillar structures, or apparatus (e.g., microelectronic component assembly, electronic system, etc.) including such metal pillar structures. Only those process acts and structures necessary to understand the embodiments of the disclosure are described in detail below. Additional acts to form a complete metal pillar structure, a complete microelectronic component equipped with such metal pillar structures, or a complete apparatus (e.g., a complete microelectronic component assembly, electronic system, etc.) including metal pillar structures as described herein may be performed by conventional fabrication processes.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles between surfaces that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, spatially relative terms, such as "beneath," "below," "lower," "bottom," "above," "over," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "over" or "above" or "on" or "on top of" other elements or features would then be oriented "below" or "beneath" or "under" or "on bottom of" the other elements or features. Thus, the term "over" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, the terms "configured" and "configuration" refer to a size, shape, material composition, orientation, and arrangement of one or more of at least one structure and at least one apparatus facilitating operation of one or more of the structure and the apparatus in a predetermined way.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein the terms "layer" and "film" mean and include a level, sheet or coating of material residing on a structure, which level or coating may be continuous or discontinuous between portions of the material, and which may be conformal or non-conformal, unless otherwise indicated.

As used herein, the term "substrate" means and includes a base material or construction upon which additional materials are formed. The substrate may be a semiconductor substrate, a base semiconductor layer on a supporting structure, a metal electrode, a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. The term "substrate" also means and includes organic substrates, for example, substrates having multiple metal layers in the form of traces and is interposed with dielectric layers (e.g., resin-glass weave polymers). For example, conventional BGA packages include multiple die and encapsulation (e.g., epoxy molding compound (EMC)) on one side of an organize substrate and an array of solder balls on the other side.

As used herein, the terms "comprising," "including," "containing," "characterized by," and grammatical equivalents thereof are inclusive or open-ended terms that do not exclude additional, unrecited elements or method steps, but also include the more restrictive terms "consisting of" and "consisting essentially of" and grammatical equivalents thereof.

As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be excluded.

As used herein, the term "microelectronic component" means and includes by way of non-limiting example, semiconductor die, die exhibiting functionality through other than semiconductive activity, microelectrical mechanical systems (MEMs) devices, substrates comprising multiple die including conventional wafers as well as other bulk substrates as mentioned above, and partial wafers and substrates including more than one die location.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

In the description and for the sake of convenience, the same or similar reference numerals may be used to identify features and elements common between various drawing figures.

Figure 4A:
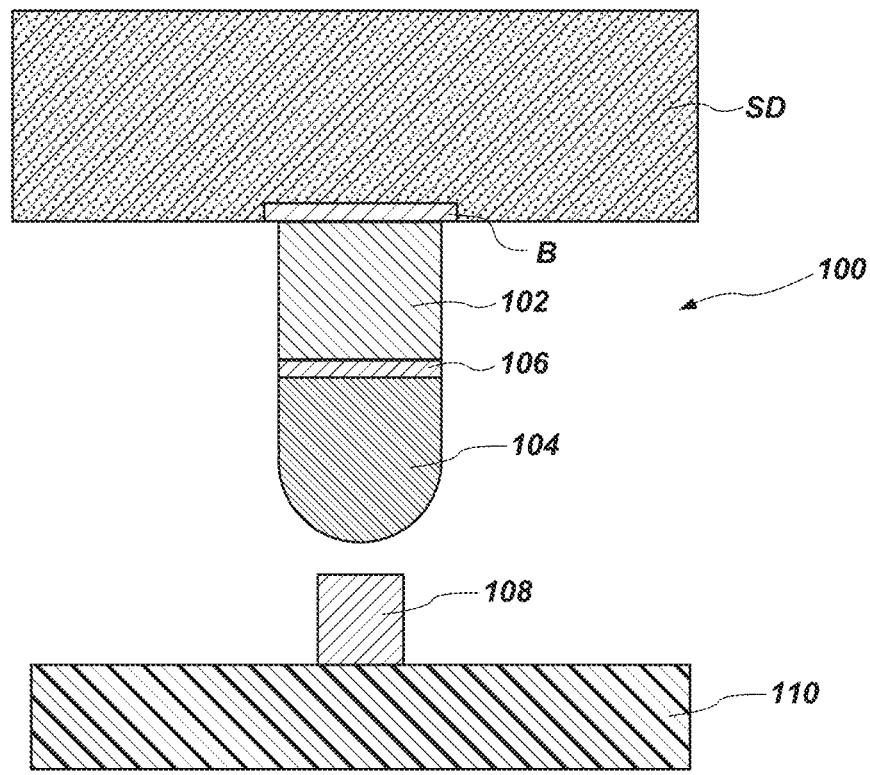
FIGS. 4A-4C are schematic side elevations of a progression of solder joint formation and subsequent failure using a cylindrical solder-capped metal pillar structure.
Figure 4B:
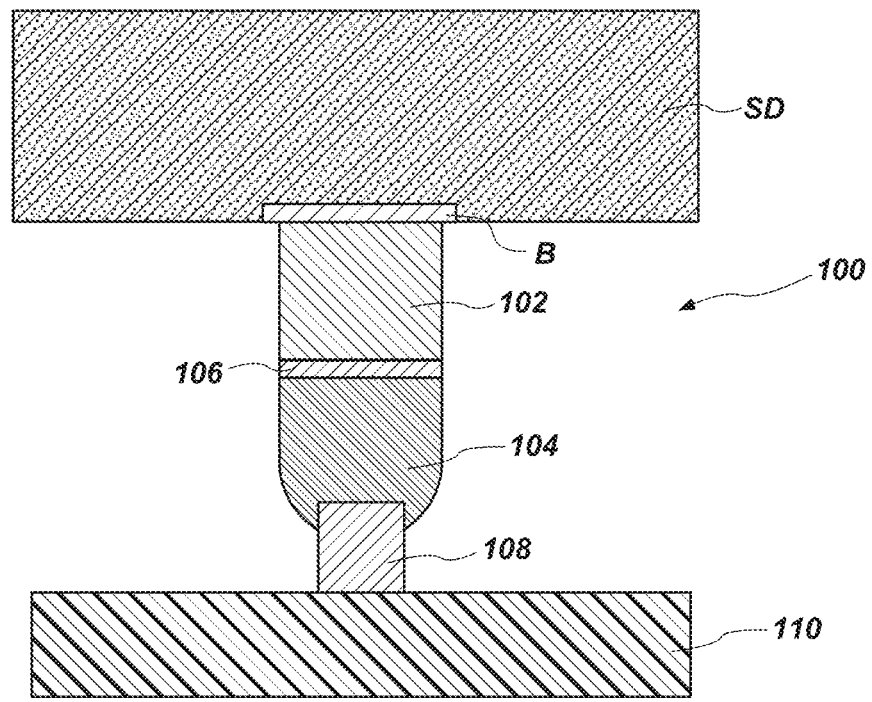
Figure 4C:
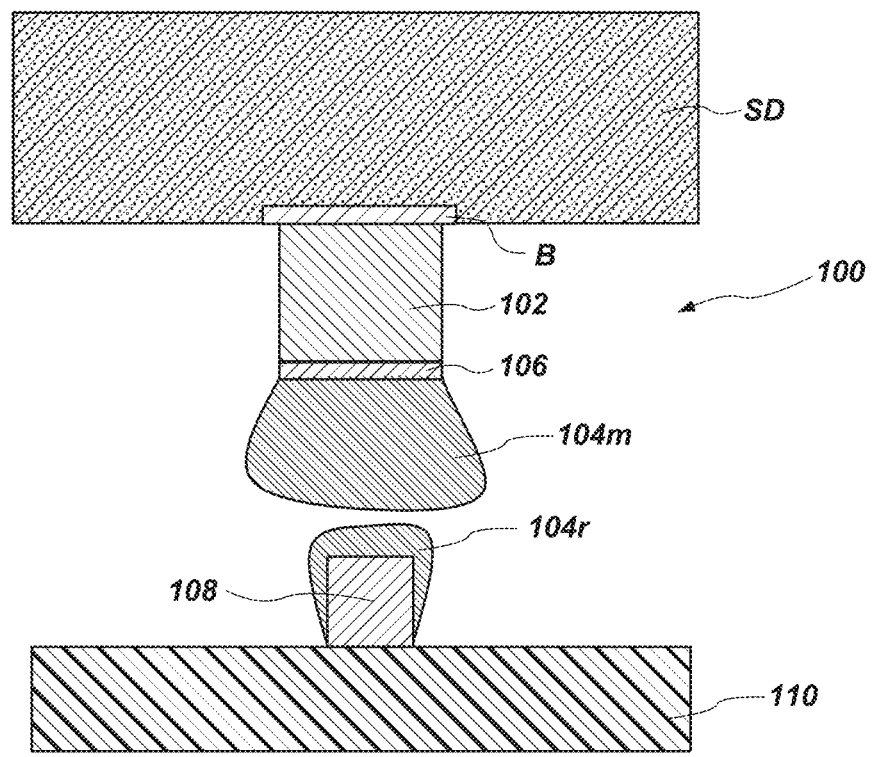

Referring now to FIGS. 3 and 4A-4C of the drawings, an example of a solder-capped metal (e.g., copper) pillar structure 100 may comprise a cylindrical, solid copper pillar 102 mounted to a bond pad B of a microelectronic component in the form of a semiconductor die SD and capped with a solder material (e.g., SnAg) 104 and having a nickel barrier layer 106 between the copper pillar 102 and the solder material 104 to prevent the copper dissolving in the solder. As shown in FIG. 4A, to bond metal pillar structure 100 to a terminal pad of another microelectronic component 110, for example, another semiconductor die or interposer, or terminal pad or conductive trace of some other substrate (generically referred to herein as a "terminal structure"), semiconductor die SD is inverted in a so-called "flip chip" orientation. Metal pillar structure 100 is then aligned with a terminal structure 108 of the other microelectronic component 110, and the assembly is heated with the solder material 104 and terminal structure 108 in proximity. Heating may be effected, for example, by thermocompression bonding of the assembly through application of Normal force and heat using a bond head, or by passing the assembly through an oven in a mass reflow process. As shown in FIG. 4B, when temperature of the assembly exceed the melting point of the solder material 104, it transitions to a liquidus solder state and wicks in the presence of a flux material to the material (e.g., copper) of the terminal structure 108. Ideally, when the assembly is cooled, the solder material 104 bonds in a solid state to the terminal structure and a robust physical and electrical connection is formed. However, as depicted in FIG. 4C, as pillar size, pitch between pillars and bond line thickness become smaller, the volume of solder material 104 may be insufficient, resulting in the abovementioned solder starvation in the region of the intended solder joint. Thus, the solder material 104 fails to form or maintain a bond between the majority of the solder material 104m, and the remainder of the solder material 104r wicked to the terminal structure 108. When this situation occurs, an open circuit may result immediately or during burn-in and characterization as infant mortality, or may result at a later time after a number of thermal cycles experienced during normal operation of the assembly. Thus, power, ground\bias and\or data signal transmission integrity may be compromised.

Figure 5:
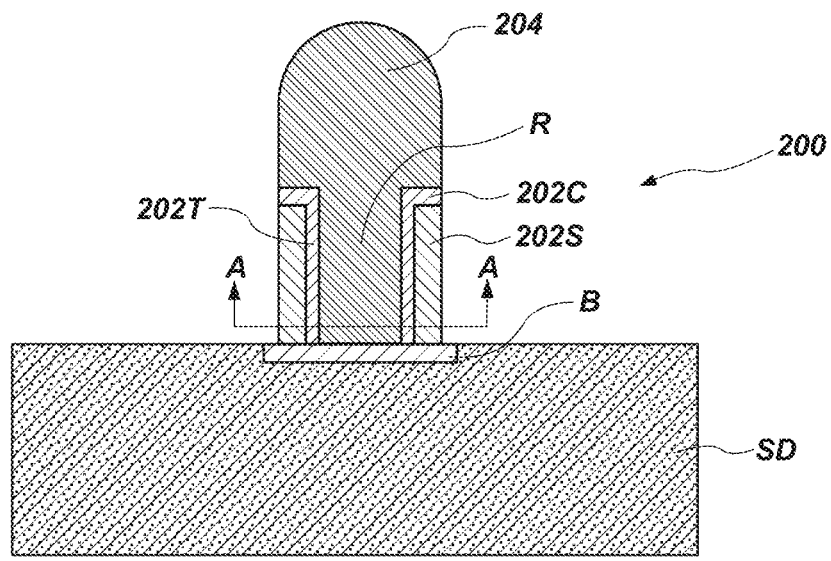
FIG. 5 is a schematic side elevation of an embodiment of a conductive element in the form of a metal pillar structure including solder capping and extending into an internal reservoir of the metal pillar.
Figure 5A:
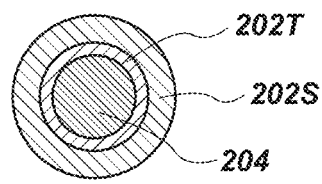
FIG. 5A is a schematic transverse cross-section taken on section line A-A of FIG. 5.
Figure 6A:
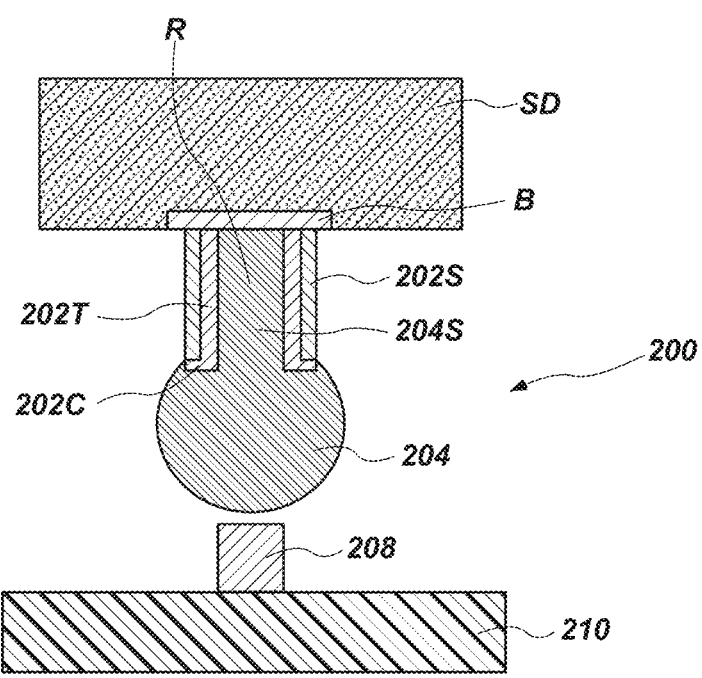
FIGS. 6A and 6B are schematic cross-sectional elevations of solder joint formation using the metal pillar structure of FIGS. 5 and 5A.
Figure 6B:
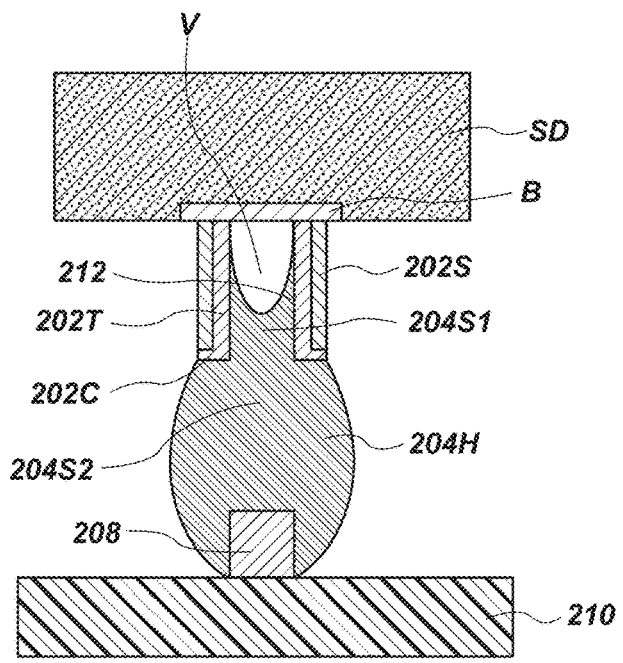

Referring now to FIGS. 5, 5A, 6A and 6B, an embodiment of a conductive element in the form of a solder-capped metal pillar structure 200 according to the disclosure is illustrated. Referring to FIGS. 5 and 5A, a tubular metal pillar structure 200 is mounted to a bond pad B of a semiconductor die SD. Tubular metal pillar structure 200 comprises a tube 202T of a barrier material, for example, nickel, having an integral collar 202C at its upper extent extending over an outer sleeve 202S of a metal, for example, copper. Other metal materials may be employed as a barrier, for example tungsten, palladium, platinum, gold, as well as, for example, nickel alloys such as nickel alloyed with cobalt, zinc, copper, or iron. Further, other metal materials may be employed for outer sleeve 202S, for example, gold. Generally, metals susceptible to electroplating may be used for the tube 202T and outer sleeve 202S, subject to plating time, reaction to solder, and cost. A wall thickness of the tube 202T and of outer sleeve 202S may be different, as depicted in FIGS. 5 and 5A or substantially the same, as depicted in FIGS. 6A and 6B. The wall thicknesses are not critical to embodiments of the disclosure as long as structural integrity of tubular metal pillar structure 200 is maintained, and the barrier material of tube 202T is of sufficient thickness to prevent reaction of the material of outer sleeve 202S with solder material. The interior of tube 202T is open at the bottom, exposing a portion of the bond pad, and provides a reservoir R bounded by the bond pad and interior side wall of tube 202T. Solder material (e.g., SnAg) 204 extends into reservoir R while protruding above tube 202T and extending laterally over collar 202C, which may also be characterized as a flange, tube 202T with collar 202C preventing dissolving of metal of the outer sleeve 202S in solder material 204. Thus, the volume of solder material 204 above collar 202C may be equivalent to the total volume of solder material in an example metal pillar structure as described above with respect to FIGS. 3 and 4A-4C for a same pillar width and height and design bond line thickness. However, the presence of reservoir R containing a supplemental volume 204S of solder material 204 within tube 202T may allow solder material volume to be increased by, for example, about fifty percent (50%) to about eighty percent (80%) depending upon the combined wall thickness of tube 202T and outer sleeve 202S.

Referring to FIGS. 6A and 6B, to bond metal pillar structure 200 to a terminal pad of another microelectronic component 210, for example, another semiconductor die or interposer, or terminal pad or conductive trace of some other substrate (generically referred to herein as a "terminal structure"), the semiconductor die SD is inverted in a so-called "flip chip" orientation. Metal pillar structure 200 is then aligned with a terminal structure 208 of the other microelectronic component as shown in FIG. 6A, and the assembly is heated with the solder material 204 and terminal structure 208 in proximity. Heating may be effected, for example, by thermocompression bonding of the assembly through application of Normal force and heat using a bond head, or by passing the assembly through an oven in a mass reflow process. As shown in FIG. 6B, when temperature of the assembly exceed the melting point of the solder material 204, it transitions to a liquidus solder state and wicks in the presence of a flux material to the material (e.g., copper) of the terminal structure 208, toward and in intimate contact with terminal structure 208, the wettability of the terminal structure 208 pulling the head 204H of molten solder material 204 due to cohesive forces of the solder molecules while a portion of supplemental volume 204S2 of solder material 204 initially contained in reservoir R flows downwardly and outwardly from reservoir R under adhesion force provided by wettability of the solder material 204 to the copper terminal structure 208 and another portion of supplemental volume 204S1 of solder material 204 remaining within the tube 202T maintains continuous contact with the interior wall 212 of tube 202T. When the assembly is cooled, the solder material solidifies and the head 204H of solder material 204 bonds in a solid state to the terminal structure 208 and some of the supplemental volume 204S1 remains within the tube 202T and bonds to the interior wall 212 of tube 202T to form a robust physical and electrical connection due to the increased available volume of solder material 204 for the solder joint. Consequently, the existence of one or more voids V within reservoir R does not detrimentally affect the solder joint and integrity of power, ground\bias and\or data signal integrity between components is enhanced.

Figure 7:
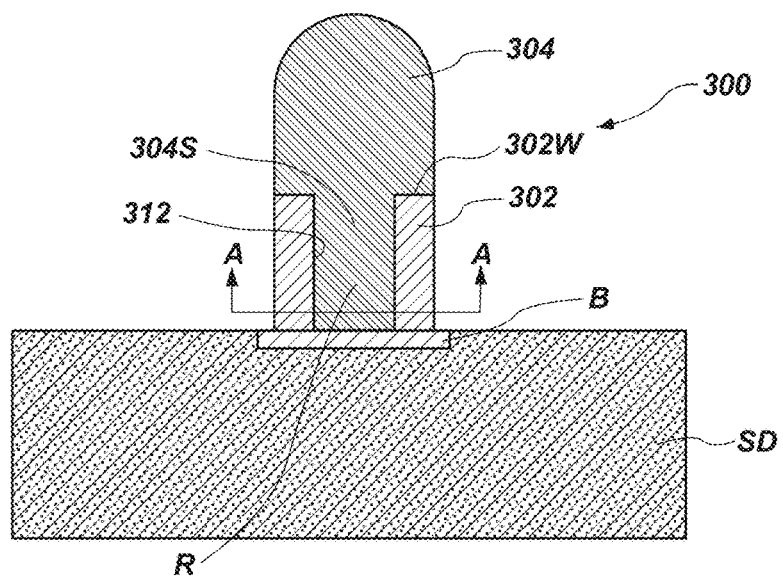
FIG. 7 is a schematic side elevation of an embodiment of a conductive element in the form of a metal pillar structure including solder capping and extending into an internal reservoir of the metal pillar.
Figure 7A:
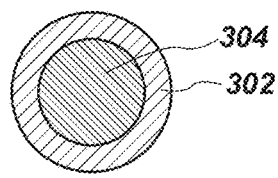
FIG. 7A is a schematic transverse cross-section taken on section line A-A of FIG. 7.

Referring now to FIGS. 7, 7A, 8A and 8B, another embodiment of a conductive element in the form of a solder-capped metal pillar structure 300 according to the disclosure is illustrated. Referring to FIGS. 7 and 7A, a metal pillar structure 300 is mounted to a bond pad B of a semiconductor die SD. Metal pillar structure 300 comprises a tube 302 of a barrier material unreactive with solder, for example, nickel, tungsten, palladium, platinum, gold, or nickel alloyed with cobalt, zinc, copper, or iron. Tube 302 may, but is not required to, have a wall thickness greater than tube 202T, which wall thickness may approximate the combined wall thicknesses of tube 202T and outer sleeve 202S. The interior of tube 302 is open at the bottom, exposing a portion of the bond pad, and provides a reservoir R into which solder material (e.g., SnAg) 304 extends while protruding above tube 302 and extending laterally over the wall 302W of tube 302. Thus, the volume of solder material 304 above the top of tube 302 may be equivalent to the total volume of solder material in a conventional metal pillar structure as described above with respect to FIGS. 3 and 4A-4C for a same pillar width and height and design bond line thickness. However, the presence of reservoir R containing supplemental volume of solder material 304S within tube 302 may allow solder material volume to be increased by, for example, about fifty percent (50%) to about eighty percent (80%), depending upon the wall thickness of tube 302.

Figure 8A:
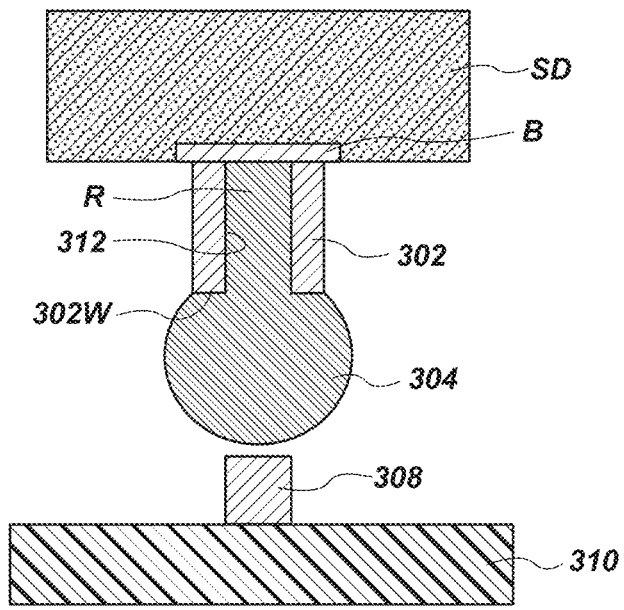
FIGS. 8A and 8B are schematic cross-sectional elevations of solder joint formation using the metal pillar structure of FIGS. 7 and 7A.
Figure 8B:
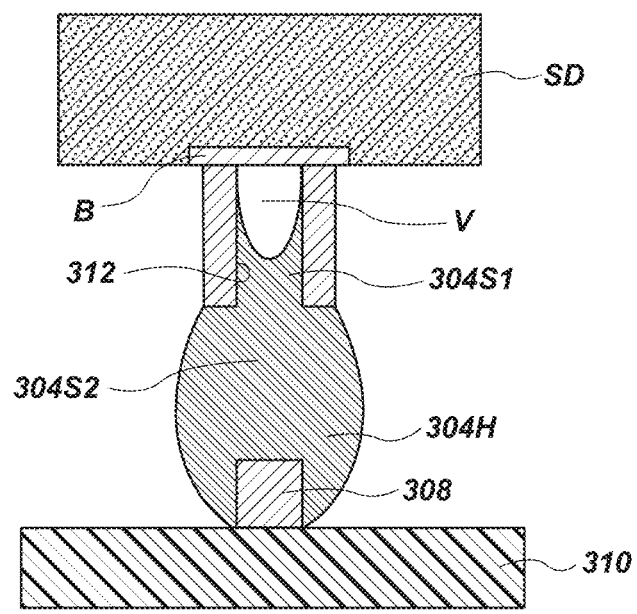

Referring to FIGS. 8A and 8B, to bond metal pillar structure 300 to a terminal pad of another microelectronic component 310, for example, another semiconductor die or interposer, or terminal pad or conductive trace of some other substrate (generically referred to herein as a "terminal structure"), the semiconductor die SD is inverted in a so-called "flip chip" orientation. Metal pillar structure 300 is then aligned with a terminal structure 308 of the other microelectronic component 310 as shown in FIG. 8A, and the assembly is heated with the solder material 304 and terminal structure 308 in proximity. Heating may be effected, for example, by thermocompression bonding of the assembly through application of Normal force and heat using a bond head, or by passing the assembly through an oven in a mass reflow process. As shown in FIG. 8B, when temperature of the assembly exceed the melting point of the solder material 304, it transitions to a liquidus state and wicks in the presence of a flux material to the material (e.g., copper) of the terminal structure 308, toward and in intimate contact with terminal structure 308, wettability of the terminal structure 308 pulling the head 304H of molten solder material 304 while a portion of supplemental volume 304S2 of solder material 304 initially contained in reservoir R flows downwardly and outwardly from reservoir R due to cohesive forces of the solder molecules and another portion of supplemental volume 304S1 of solder material 304S remains within the tube 302 maintaining continuous contact with the interior wall 312 of tube 302. When the assembly is cooled, solder material solidifies and the head 304H of solder material 304 bonds in a solid state to the terminal structure 308 and some of the supplemental volume of solder material 304S bonds to interior wall 312 of tube 302 to form a robust physical and electrical connection due to the increased available volume of solder material 304 for the solder joint. Consequently, the existence of one or more voids V within reservoir R does not detrimentally affect the solder joint. Consequently, the existence of one or more voids V within reservoir R does not detrimentally affect the solder joint and integrity of power, ground\bias and\or data signal integrity between components is enhanced.

It will be appreciated by those of ordinary skill in the art that implementation of embodiments of the disclosure is independent of a particular solder material employed, or of the material or materials, height, width, or shape of the metal pillar employed, as long as the material of the component or components of the metal pillar structure, the solder material and the terminal structure to which the solder material is to bonded are compatible for mutual bonding. It will also be appreciated that conductive elements in the form of the metal pillar structure of embodiments of the disclosure may be implemented using existing materials, processes and equipment. Implementation of embodiments of the metal pillar structures may increase product (i.e., microelectronic component) yield during internal and external qualification processes, and a reduction in infant mortality during burn-in and thermal cycle testing. The increased solder volumes and resulting robust solder joints may also increase operational longevity of microelectronic components equipped with the metal pillar structures, particularly in high thermal stress environment such as automotive and serve applications. The foregoing, and other advantages may be achieved while accommodating and facilitating ever-smaller form factors, pillar pitches and sizes and lower bond line thicknesses while maintaining product reliability.

Further, while the conductive elements formed as solder-capped metal pillar structures 200 and 300 have been depicted and described in the context of connecting pillars and bond pads for the purpose of power, ground\bias and data signal transmission between adjacent microelectronic components, such conductive elements may also find utility as outrigger elements or standoff elements between components, such outrigger or standoff elements being isolated from circuitry of adjacent components (i.e., dummy pillars connected to dummy bond pads) and placed at appropriate locations for structural support of stacked microelectronic components and to provide enhanced bond line uniformity of dielectric material thickness (e.g., non-conductive film (NCF), wafer-level underfill (WLUF), capillary underfill) between superimposed components.

Figure 9:
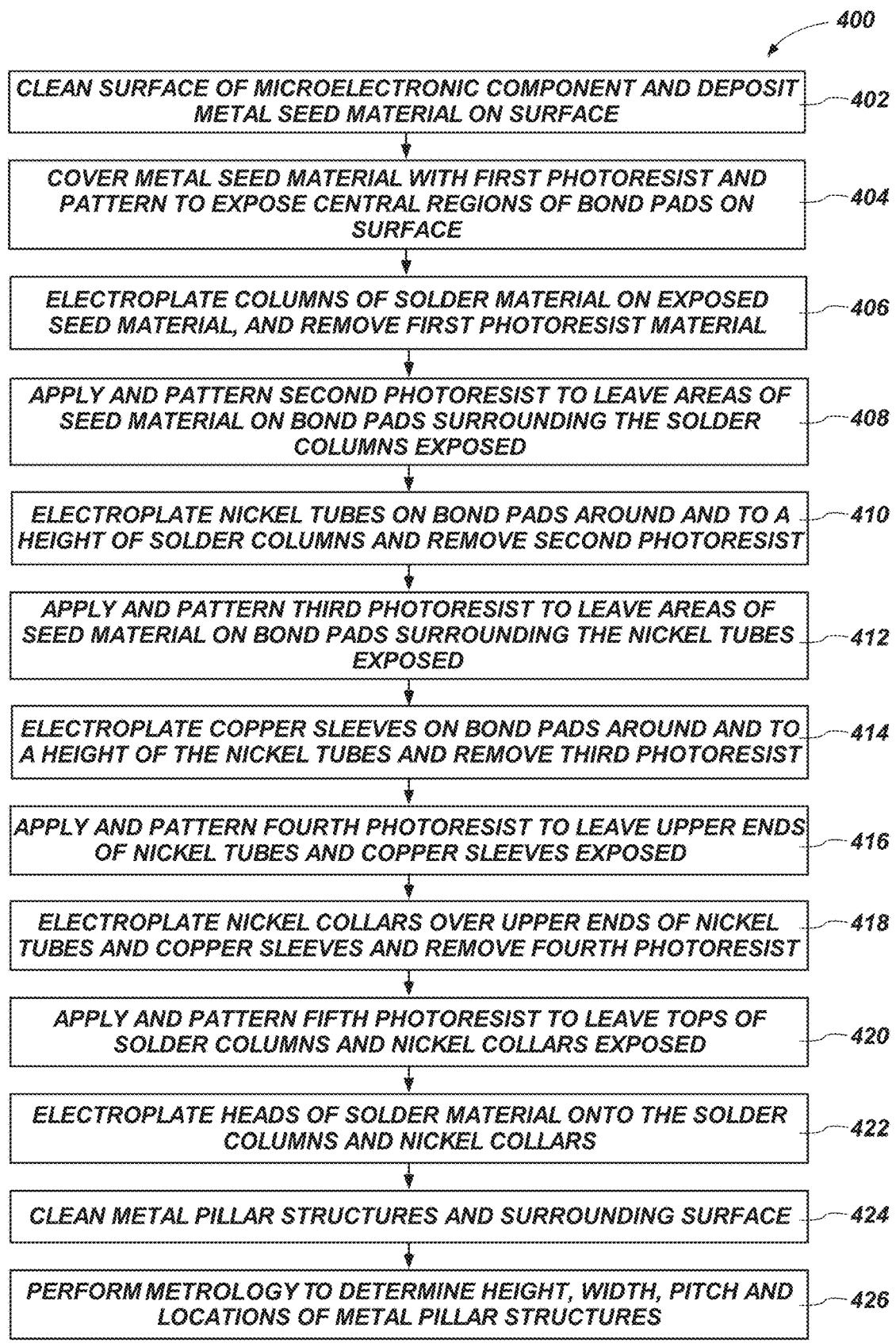
FIG. 9 is a flow diagram of a process according to embodiments of the disclosure for forming metal pillar structures of FIGS. 5 and 5A.

FIG. 9 depicts an example process flow 400 for fabrication of conductive elements in the form of metal pillar structures of the embodiment of FIGS. 5 and 5A. In act 402, a surface (e.g., active surface) of a microelectronic component (e.g., semiconductor die) is cleaned, and a metal seed material is deposited (e.g., sputtered) onto the surface. In act 404, the metal seed material is covered with a first photoresist material, which is then patterned (such term including exposure and developing, as is conventional) expose seed material on central regions of bond pads on surface of the component. In act 406, columns of solder material are electroplated onto the exposed seed material and the first photoresist material removed. In act 408, a second photoresist material is applied and patterned to leave areas of the seed material on the bond pads surrounding the solder columns exposed, and in act 410 nickel tubes are electroplated on the bond pads around and to a height of the solder columns and the second photoresist material removed. In act 412, a third photoresist material is applied and patterned to leave areas of seed material on the bond pads surrounding the nickel tubes exposed. In act 414, copper sleeves are electroplated on the bond pads around and to a height of the nickel tubes and the third photoresist material removed. In act 416, a fourth photoresist material is applied and patterned to leave the upper ends of the nickel tubes and copper sleeves exposed. In act 418, nickel collars are electroplated over the upper ends of the nickel tubes and copper sleeves and the fourth photoresist material removed. In act 420, a fifth photoresist material is applied and patterned to leave the tops of the solder columns and the nickel collars exposed. In act 422, heads of solder material are electroplated onto the solder columns and nickel collars to complete the metal pillar structures. In act 424, the metal pillar structures and surrounding surface are cleaned by, for example, a wet strip, descum and wet etch, and in act 426, metrology may be performed to determine height, width, pitch and proper locations of the metal pillar structures. The respective photoresists may each be of the same formulation, or of different formulations, the selection of which is not material to the process. In another process approach, copper pillars may be electroplated onto seed material, then etched to form cups with bottoms adjacent bond pads, and then a barrier material such as nickel electroplated over the copper cup to form another cup with a collar of barrier material extending over the wall of the copper cup. As a further alternative, rather than electroplating solder material as an initial column, the remainder of the pillar structure may be formed first by appropriate masks and electroplating, the pillars dipped flux and the reservoirs filled with solder material, for example in a molten state, wicked into the reservoirs, surface tension of excess solder material above the pillar forming a head on the pillar upon solidification.

Figure 10:
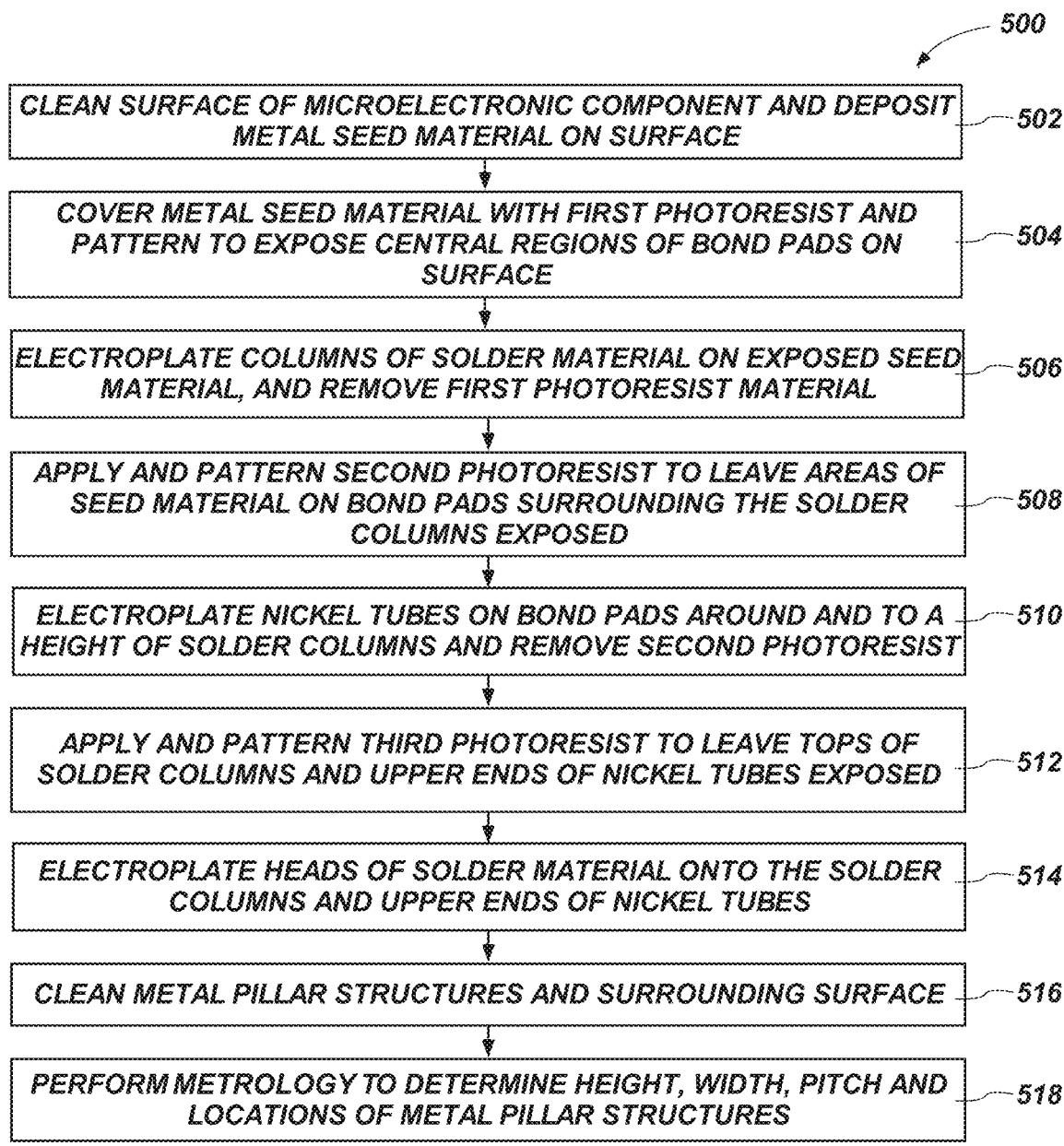
FIG. 10 is a flow diagram of a process according to embodiments of the disclosure for forming metal pillar structures of FIGS. 7 and 7A.

FIG. 10 depicts an example process flow 500 for fabrication of conductive elements in the form of metal pillar structures of the embodiment of FIGS. 7 and 7A. In act 502, a surface (e.g., active surface) of a microelectronic component (e.g., semiconductor die) is cleaned, and a metal seed material is deposited (e.g., sputtered) onto the surface. In act 504, the metal seed material is covered with a first photoresist material, which is then patterned (such term including exposure and developing, as is conventional) to expose seed material on central regions of bond pads on the surface of the component. In act 506, columns of solder material are electroplated onto the exposed seed material and the first photoresist material removed. In act 508, a second photoresist material is applied and patterned to leave seed material on areas of the bond pads surrounding the solder columns exposed, and in act 510 nickel tubes are electroplated on the bond pads around and to a height of the solder column and the second photoresist removed. In act 512 a third photoresist is applied and patterned to leave the tops of the solder columns and the upper ends of the nickel tubes exposed. In act 514, heads of solder material are electroplated onto the solder columns and upper ends of the nickel tubes to complete the metal pillar structures. In act 516, the metal pillar structures and surrounding surface are cleaned by, for example, a wet strip, descum and wet etch, and in act 518 metrology may be performed to determine height, width, pitch and proper locations of the metal pillar structures. The respective photoresists may each be of the same formulation, or of different formulations, the selection of which is not material to the process. As a further alternative, rather than electroplating solder material as an initial column, the remainder of the pillar structures may be formed first by appropriate masks and electroplating, the pillars dipped in solder and the reservoirs filled with solder material, for example in a molten state wicked into the reservoirs, surface tension of excess solder material above the pillar forming a head on the pillar upon solidification.

Figure 11:
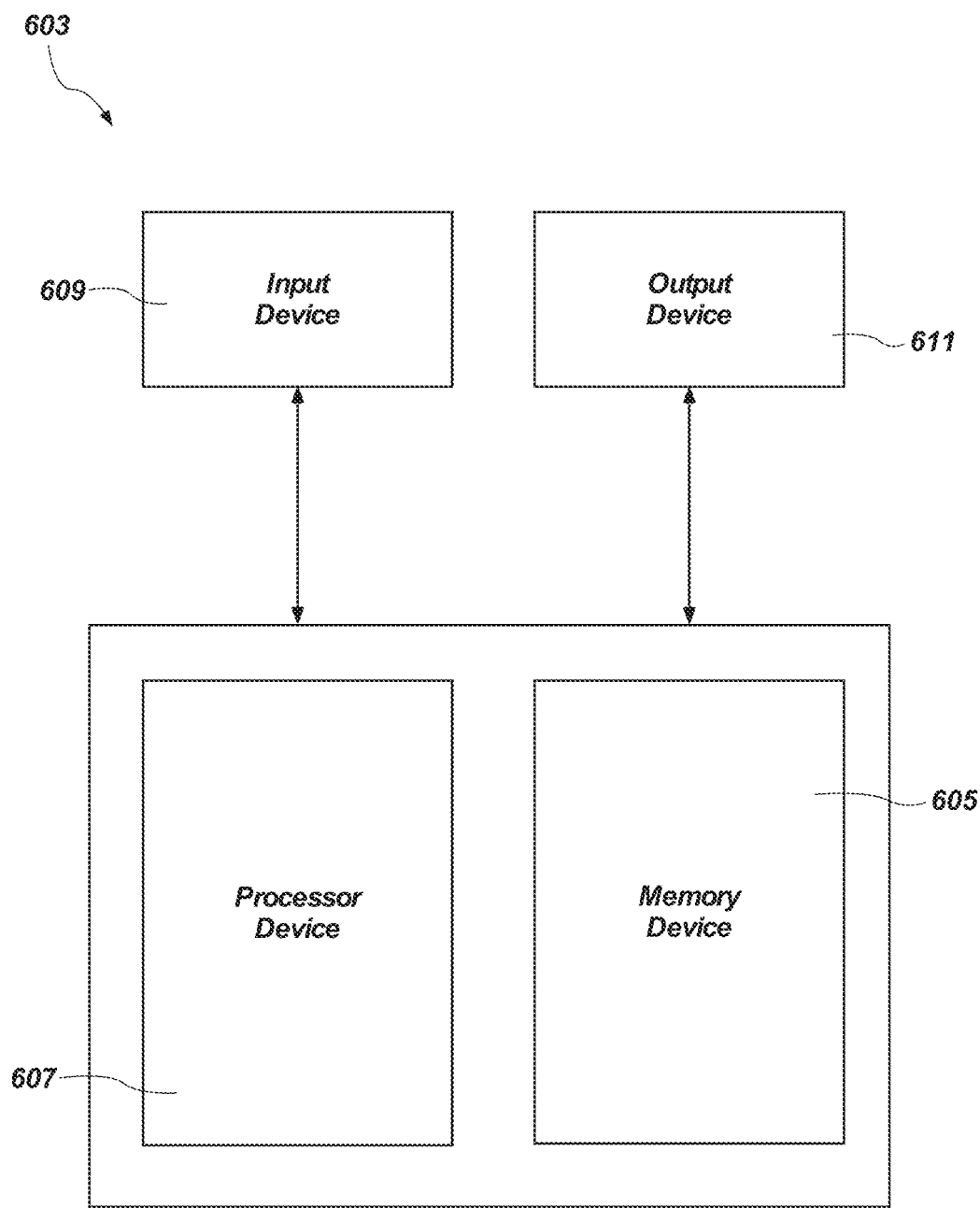
FIG. 11 is a block diagram of a processor-based system including microelectronic components including interconnections comprising conductive elements in the form of metal pillar structures according to embodiments of the disclosure.

Microelectronic components including metal pillars structures according to embodiments of the disclosure may be used in electronic systems. For example, FIG. 11 is a block diagram of an electronic system 603, in accordance with embodiments of the disclosure. The electronic system 603 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, an automotive infotainment system, a self-driving vehicle control system, etc. The electronic system 603 includes at least one memory device 605. The at least one memory device 605 may include, for example, metal pillar structures according to embodiments of the disclosure.

The electronic system 603 may further include at least one electronic signal processor device 607 (often referred to as a "microprocessor"). The electronic signal processor device 607 may include metal pillar structures according to embodiments of the disclosure. The electronic system 603 may further include one or more input devices 609 for inputting information into the electronic system 603 by a user, such as, for example, a mouse or other pointing device, a keyboard, a touchpad, a button, or a control panel. The electronic system 603 may further include one or more output devices 611 for outputting information (e.g., visual or audio output) to a user such as, for example, a monitor, a display, a printer, an audio output jack, a speaker, etc. In some embodiments, the input device 609 and the output device 611 may comprise a single touchscreen device that can be used both to input information to the electronic system 603 and to output visual information to a user. The input device 609 and the output device 611 may communicate electrically with one or more of the memory device 605 and the electronic signal processor device 607. At least some of the foregoing devices may be mounted to a one or more substrates, for example an interposer, a motherboard or other circuit board, using metal pillar structures according to embodiments of the disclosure.

In embodiments, a microelectronic component comprises a substrate having at least one bond pad on a surface thereof and a metal pillar structure on the at least one bond pad. The metal pillar structure comprises a metal pillar on the at least one bond pad and a solder material having a portion within a reservoir within the metal pillar and another portion protruding from an end of the metal pillar opposite the at least one bond pad.

In embodiments, a process comprises cleaning a surface of a microelectronic component having bond pads thereon and depositing a seed material on the surface, applying and patterning a first photoresist material to expose seed material on the bond pad and electroplating columns of solder material onto the exposed seed material and removing the first photoresist material. Applying and patterning second photoresist material to leave areas of seed material surrounding the solder columns exposed, electroplating nickel tubes on the bond pads around and to a height of the solder columns and removing the second photoresist material. Applying and patterning a third photoresist material to leave areas of seed material exposed on the bond pads surrounding the nickel tubes, electroplating copper sleeves on the bond pads around and to a height of the nickel tubes and removing the third photoresist material. Applying and patterning a fourth photoresist material to leave upper ends of the nickel tubes and copper sleeve exposed, electroplating nickel collars over the upper ends of the nickel tubes and copper sleeves and removing the fourth photoresist material. Applying and patterning a fifth photoresist material to leave tops of the solder columns and the nickel collars exposed, electroplating heads of solder material onto the solder columns and the nickel collars to form metal pillar structures, and cleaning the metal pillar structures and surrounding surface.

In embodiments, a process comprises cleaning a surface of a microelectronic component having bond pads thereon and depositing a seed material on the surface, applying and patterning a first photoresist material to expose seed material on the bond pads, electroplating columns of solder material onto the exposed seed material and removing the first photoresist material. Applying and patterning a second photoresist material to leave areas of seed material surrounding the solder columns exposed, electroplating nickel tubes on the bond pads around and to a height of the solder columns and removing the second photoresist material. Applying and patterning a third photoresist material to leave tops of the solder columns and upper ends pf the nickel tubes exposed, electroplating heads of solder material onto the solder columns and upper ends of the nickel tubes to form metal pillar structures and cleaning the metal pillar structures and surrounding surface.

In embodiments, a microelectronic component assembly comprises a first microelectronic component, a second microelectronic component at least partially superimposed over the first microelectronic component and metal pillar structures extending between the first microelectronic component and the second microelectronic component. The metal pillar structures comprise tubular metal pillars on bond pads of the first microelectronic component and a solder material, a portion of the solder material of each metal pillar structure located within a reservoir provided by an interior of the tubular metal pillar and another portion of the solder material protruding from an end of the tubular metal pillar and secured to a terminal structure of the second microelectronic component.

In embodiments, a metal pillar structure for a microelectronic component comprises a metal tube secured to a bond pad and solder material within the metal tube and extending from an end thereof opposite the bond pad.

In embodiments, a method of joining conductive structures of microelectronic components comprises placing a first microelectronic component over a second microelectronic component, aligning a metal pillar structure protruding from the first microelectronic component with a terminal structure of the second microelectronic component and heating the first and second microelectronic components to a temperature above a melting point of solder material within a metal pillar of the metal pillar structure and protruding from the metal pillar to cause molten solder material protruding from the metal pillar to wick to the terminal structure and pull molten solder material from within the metal pillar. Reduce a temperature of the first and second microelectronic components below the melting point of the solder material to solidify the solder material to bond to an interior surface of the metal pillar and to the terminal structure.

In embodiments, an electronic system comprises one or more input devices, one or more output devices, one or more microprocessor devices and one or more memory device, at least one of the input devices, output devices, microprocessor device and memory devices configured as microelectronic components. At least one of the input devices, output devices, microprocessor device and memory devices is configured with a substrate, wherein at least one microelectronic component comprises electrical connections to another microelectronic component or to a substrate, the electrical connections configured as tubular metal pillars having solder material bonded to interiors thereof, extending therefrom and bonded to the other microelectronic component or the substrate.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic component, comprising:
   at least one bond pad on a substrate surface; and
   a metal pillar structure secured to the at least one bond pad, the metal pillar structure comprising:
      a metal tube; and
      a solder material substantially filling and protruding from the metal tube.

2. The microelectronic component of claim 1, wherein the protruding solder material extends laterally over a wall of the metal tube.

3. The microelectronic component of claim 1, wherein the metal tube comprises a sleeve of a first metal material reactive with the solder material and another tube of a second metal material unreactive with the solder material within the sleeve and extending laterally outwardly over an end of the sleeve.

4. The microelectronic component of claim 3, wherein the first metal material comprises copper or gold, and the second metal material comprises nickel, tungsten, palladium, platinum, gold, or an alloy of nickel including cobalt, zinc, copper, or iron.

5. The microelectronic component of claim 1, wherein the metal tube comprises a single metal material unreactive with the solder material.

6. The microelectronic component of claim 5, wherein the single metal material comprises nickel, tungsten, palladium, platinum, gold, or an alloy of nickel including cobalt, zinc, copper, or iron.

7. A microelectronic component assembly, comprising:
a first microelectronic component;
a second microelectronic component at least partially superimposed over the first microelectronic component; and
conductive pillars extending between the first microelectronic component and the second microelectronic component, the conductive pillars comprising metal tubes on bond pads of the first microelectronic component and a solder material within each metal tube protruding from the metal tube and bonded to a terminal of the second microelectronic component.

8. The microelectronic component assembly of claim 7, further comprising a metal sleeve around each metal tube, each metal tube including a collar extending laterally outward over an end of the metal sleeve and the solder material extending laterally outward over the collar.

9. The microelectronic component assembly of claim 7, further comprising voids within the metal tubes between the solder material and the bond pads.

10. A conductive element for a microelectronic component, comprising:
a hollow metal pillar secured to a bond pad; and
solder material substantially filling an interior of the hollow metal pillar and extending from an end thereof.

11. The conductive element of claim 10, wherein the solder material extending from the end of the hollow metal pillar extends laterally over the hollow metal pillar.

12. The conductive element of claim 10, wherein the hollow metal pillar comprises a metal sleeve and a metal tube within the metal sleeve comprising a collar extending over an end of the metal sleeve.

13. The conductive element of claim 12, wherein the solder material substantially filling the hollow metal pillar and extending from an end thereof extends laterally over the collar.

14. The conductive element of claim 12, wherein the metal tube comprises nickel, tungsten, palladium, platinum, gold, or an alloy of nickel including cobalt, zinc, copper, or iron and the metal sleeve comprises copper.

15. The conductive element of claim 10, wherein the hollow metal pillar consists of a single metal tube comprising nickel, tungsten, palladium, platinum, gold, or an alloy of nickel including cobalt, zinc, copper, or iron nickel.

16. The conductive element of claim 10, wherein an interior surface of the hollow metal pillar comprises a metal unreactive with the solder material.

17. An electronic system comprising:
one or more input devices;
one or more output devices;
one or more microprocessor devices; and
one or more memory devices,
at least one of the input devices, output devices, microprocessor device and memory devices configured as microelectronic components,
wherein at least one microelectronic component comprises electrical connections to another microelectronic component or to a substrate, the electrical connections configured as tubular metal pillars extending from bond pads and having solder material bonded to interiors thereof, extending therefrom and bonded to the another microelectronic component or the substrate, the tubular metal pillars having an interior void between the solder materials and the bond pads.

* * * * *